US008824238B2

(12) United States Patent
Chen et al.

(10) Patent No.: US 8,824,238 B2
(45) Date of Patent: Sep. 2, 2014

(54) MEMORY DEVICE WITH BI-DIRECTIONAL TRACKING OF TIMING CONSTRAINTS

(71) Applicant: Etron Technology, Inc., Hsinchu (TW)

(72) Inventors: Ho-Yin Chen, Hsinchu County (TW); Hung-Jen Chang, Changhua County (TW); Chun Shiah, Hsinchu (TW)

(73) Assignee: Etron Technoloy, Inc., Hsinchu (TW)

( * ) Notice: Subject to any disclaimer, the term of this patent is extended or adjusted under 35 U.S.C. 154(b) by 29 days.

(21) Appl. No.: 13/849,557

(22) Filed: Mar. 25, 2013

(65) Prior Publication Data

US 2014/0050038 A1    Feb. 20, 2014

(30) Foreign Application Priority Data

Aug. 17, 2012    (TW) .............................. 101129914 A

(51) Int. Cl.
*G11C 7/22*     (2006.01)
*G11C 8/08*     (2006.01)
*G11C 29/50*    (2006.01)
*G11C 29/02*    (2006.01)
*G11C 29/12*    (2006.01)

(52) U.S. Cl.
CPC ...... *G11C 29/023* (2013.01); *G11C 2029/1202* (2013.01); *G11C 8/08* (2013.01); *G11C 29/50012* (2013.01); *G11C 7/227* (2013.01)
USPC ........................ 365/233.5; 365/193; 365/203

(58) Field of Classification Search
CPC ....................................................... G11C 7/227
USPC .......................................................... 365/233.5
See application file for complete search history.

(56) References Cited

U.S. PATENT DOCUMENTS

| | | | | |
|---|---|---|---|---|
| 5,867,449 | A * | 2/1999 | Casper | 365/233.5 |
| 6,208,575 | B1 * | 3/2001 | Proebsting | 365/208 |
| 2012/0163110 | A1 * | 6/2012 | Sinha et al. | 365/203 |
| 2013/0322193 | A1 * | 12/2013 | Sahu et al. | 365/194 |
| 2013/0329505 | A1 * | 12/2013 | Yang et al. | 365/189.11 |

* cited by examiner

*Primary Examiner* — Harry W Byrne
*Assistant Examiner* — Lance Reidlinger
(74) *Attorney, Agent, or Firm* — Winston Hsu; Scott Margo

(57) ABSTRACT

A memory device includes a DRAM, a first bi-directional tracking circuit and a second bi-directional tracking circuit. The DRAM includes a cell, a word line and a bit line. The first bi-directional tracking circuit is configured to track a first timing constraint associated with turning on or turning off the word line. The second bi-directional tracking circuit is configured to track a second timing constraint associated with turning on the bit line, turning off the bit line, or accessing the cell via the bit line.

11 Claims, 3 Drawing Sheets

MEMORY DEVICE WITH BI-DIRECTIONAL TRACKING OF TIMING CONSTRAINTS

BACKGROUND OF THE INVENTION

1. Field of the Invention

The present invention is related to a memory device which tracks timing constraints, and more particularly, to a memory device with bi-directional tracking of timing constraints.

2. Description of the Prior Art

Random access memory is a data storage device categorized into two types: static random access memory (SRAM) and dynamic random access memory (DRAM). In DRAM, each memory cell includes a transistor and a capacitor. The capacitor may either be charged or discharged. The transistor may function as a switch which allows a peripheral control circuit to access or change the status of the capacitor. Due to capacitor charge leakage, DRAM is required to periodically execute refresh operation in order to maintain accurate data.

After a DRAM receives a specific command, an execution time is required to complete the corresponding operation, after which a waiting period is required in order to guarantee that the next command can accurately be received. The above execution time and the waiting time can be defined by various timing constraints which need to be satisfied when operating the DRAM. The operation of DRAM generally involves many timing constraints with different restricting durations. For each timing constraint, a corresponding uni-directional tracking circuit is disposed in the prior art in order to improve the efficiency of the controller. However, using a large number of uni-directional tracking circuits may increase design complexity and manufacturing costs. In another prior art, a simple controller can be used by applying the loosest timing constraint, but the overall operational efficiency may be downgraded.

SUMMARY OF THE INVENTION

The present invention provides a memory device with bi-directional tracking of timing constraints. The memory device includes a DRAM, a first bi-directional tracking circuit and a second bi-directional tracking circuit. The DRAM includes a cell; a word line for turning on or turning off the cell; and a bit line for writing a first charge into the cell or receiving a second charge stored in the cell. The first bi-directional tracking circuit is configured to track a first timing constraint which is associated with an operation of turning on the word line or turning off the word line. The second bi-directional tracking circuit is configured to track a second timing constraint which is associated with an operation of turning on the bit line, turning off the bit line, the bit line writing the first charge into the cell, or the bit line reading the second charge from the cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
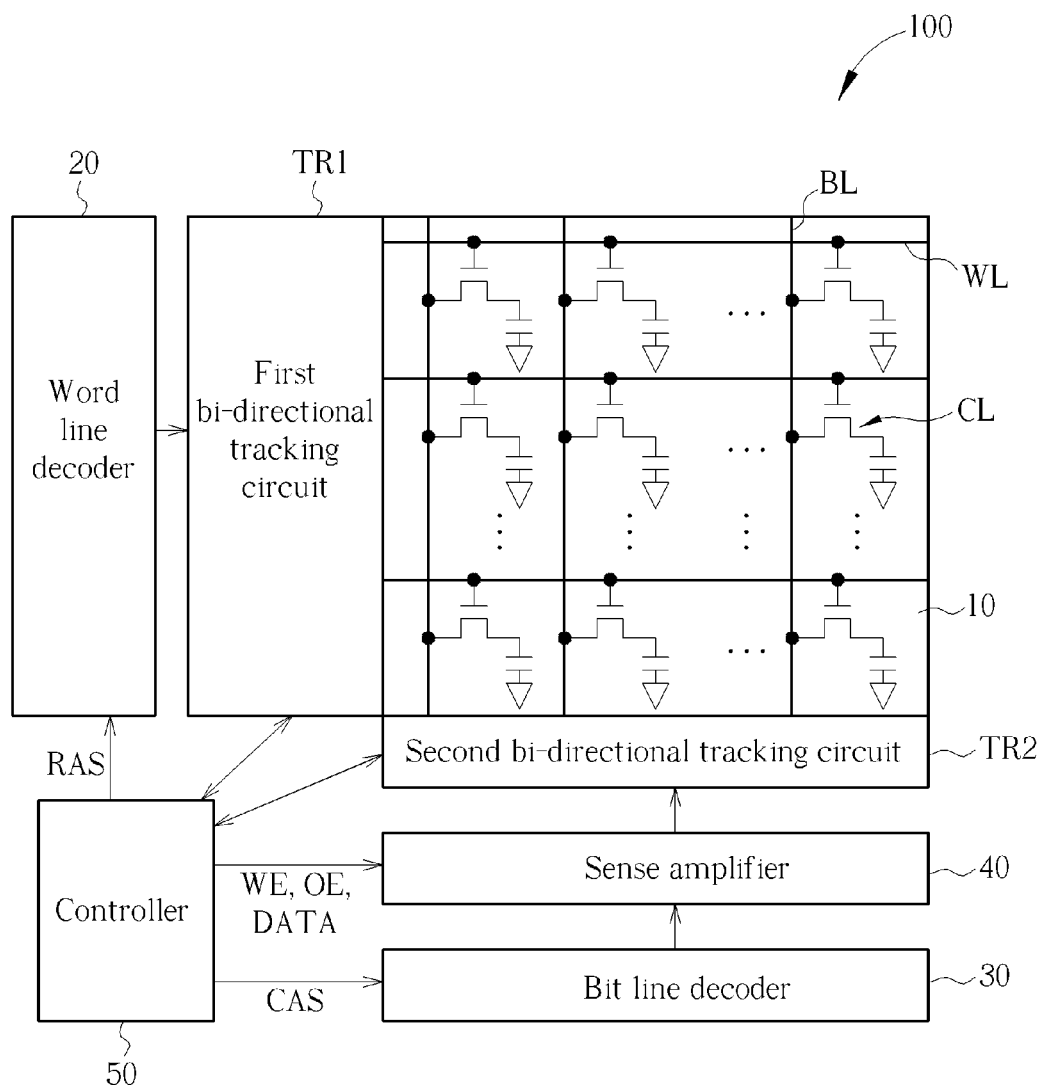
FIG. 1 is a functional diagram of a memory device according to the present invention.

FIG. 1 is a functional diagram of a memory device 100 according to the present invention. The memory device 100 includes a DRAM 10, a word line decoder 20, a bit line decoder 30, a sense amplifier 40, a controller 50, a first bi-directional tracking circuit TR1, and a second bi-directional tracking circuit TR2.

The DRAM 10 includes a plurality of parallel word lines WL, a plurality of parallel bit lines BL, and a plurality of cells CL. The word lines WL are disposed perpendicular to the bit lines BL. The cells CL are disposed at the intersections of the corresponding word lines WL and bit lines BL, thereby forming a memory array. In an embodiment of the present invention, each cell includes a capacitor and a transistor. The transistor includes a first end coupled to a corresponding word line, a second end coupled to a corresponding bit line, and a third end. The capacitor is coupled between the third end of the transistor and a bias voltage.

The controller 50 is configured to provide control signals for operating the DRAM 10, such as a row address strobe signal RAS, a column address strobe signal CAS, a write enable signal WE, an output enable signal OE, and a data signal DATA. The word line decoder 20 is configured to select corresponding word lines according to the row address strobe signal RAS, thereby sequentially turning on each row of cells. The bit line decoder 30 is configured to select corresponding bit lines according to the column address strobe signal CAS, so that the sense amplifier 40 may write the data signal DATA into corresponding cells or read the data signal DATA stored in corresponding cells according to the write enable signal WE and the output enable signal OE.

As well-known to those skilled in the art, the control signal of the DRAM 10 may includes active, precharge, refresh, mode register set (MRS), self-refresh entry (SRE), power down entry, ZQ calibration long (ZQCL) or ZQ calibration short (ZQCS). Corresponding timing constraints must be satisfied when issuing a control signal.

Main timing constraints of the DRAM 10 include a RAS precharge time $T_{RP}$, a RAS to CAS delay time $T_{RCD}$, a row cycle time $T_{RC}$, a write recovery time $T_{WR}$, a RAS access time $T_{RAS}$ and an overdrive time $T_{OD}$, etc. The RAS precharge time $T_{RP}$ is the interval taken between when a precharge command and the next active command can be issued to the same memory bank. The RAS to CAS delay time $T_{RCD}$ is the interval required between the memory controller asserting a row address, and then asserting a column address during the subsequent read or write command. The RAS access time $T_{RAS}$ is the interval taken between when an active command and the next precharge command can be issued to the same memory bank. The write recovery time $T_{WR}$ is the interval taken between when a write command and the next precharge command can be issued to the same memory bank. The overdrive time $T_{OD}$ is the length during which the cell is charged by a voltage higher than the data signal DATA.

The first tracking circuit TR1 of the present invention is configured to track a timing constraint associated with turning on the word line (such as RAS to CAS delay time $T_{RCD}$) or a timing constraint associated with turning off the word line (such as RAS precharge time $T_{RP}$). The second tracking circuit TR2 of the present invention is configured to track a timing constraint associated with precharging the bit line (such as write recovery time $T_{WR}$), a timing constraint associated with sensing the bit line (such as overdrive time $T_{OD}$), a timing constraint associated with writing from the bit line into the cell (such as RAS access time $T_{RAS}$ and write recovery time $T_{WR}$), and a timing constraint associated with reading from the cell to the bit line (such as RAS to CAS delay time $T_{RCD}$).

Figure 2:
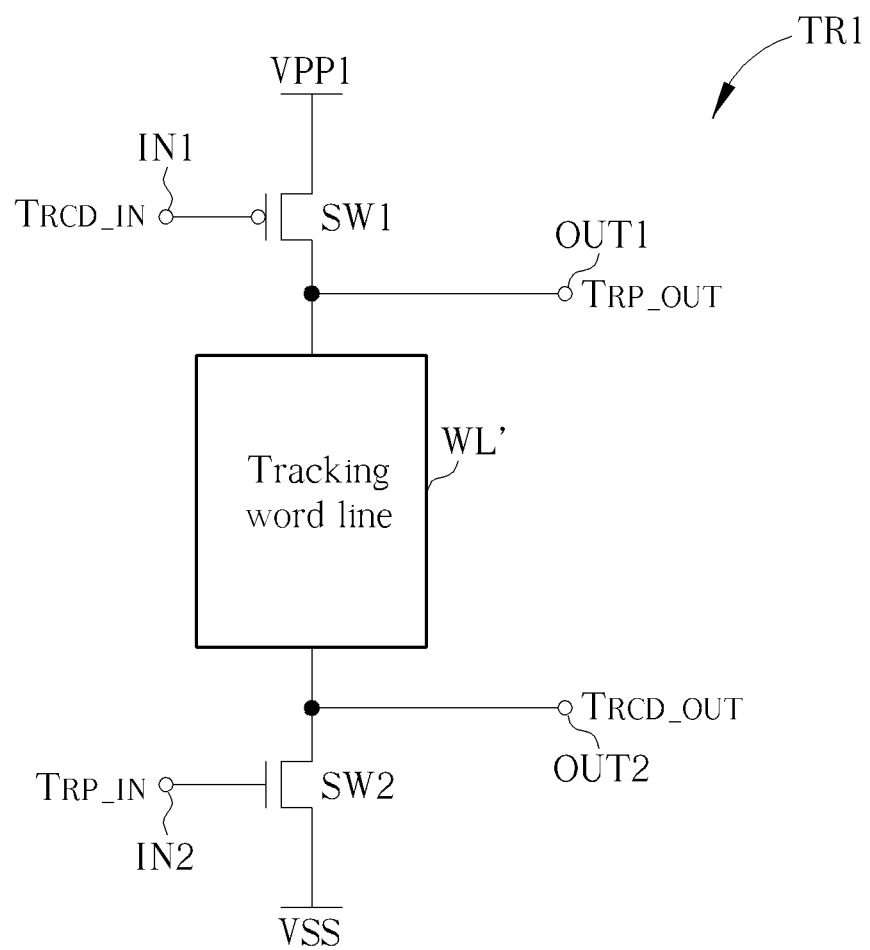
FIGS. 2 and 3 are diagrams of tracking circuits according to embodiments of the present invention.

FIG. 2 is a diagram of the first tracking circuit TR1 according to an embodiment of the present invention. The first tracking circuit TR1 includes a tracking word line WL', switches SW1-SW2, input ends IN1-IN2, and output ends OUT1-OUT2. The switch SW1 includes a first end coupled to a bias voltage VPP1, a second end coupled to the output end OUT1, and a control end coupled to the input end IN1. The switch SW2 includes a first end coupled to a bias voltage VSS, a second end coupled to the output end OUT2, and a control end coupled to the input end IN2. The switches SW1 and SW2 may be complimentary transistors. In an embodiment, the switch SW1 may be a P-type metal-oxide-semiconductor field-effect transistor (P-MOSFET), the switch SW2 may be an N-type metal-oxide-semiconductor field-effect transistor (N-MOSFET), and the bias voltage VPP1 is larger than the bias voltage VSS.

When receiving an input signal $T_{RCD\_IN}$ at the input end IN1, the switch SW1 is turned on and the tracking word line WL' is activated by the bias voltage VPP1, thereby allowing the first tracking circuit TR1 to provide an output signal $T_{RCD\_OUT}$ associated with the RAS to CAS delay time $T_{RCD}$ at the output end OUT2. When receiving an input signal $T_{RP\_IN}$ at the input end IN2, the switch SW2 is turned on and the tracking word line WL' is deactivated by the bias voltage VSS, thereby allowing the first tracking circuit TR1 to provide an output signal $T_{RP\_OUT}$ associated with the RAS precharge time $T_{RP}$ at the output end OUT1. Therefore, the controller 50 may track the RAS to CAS delay time $T_{RCD}$ according to the output signal $T_{RCD\_OUT}$ or track the RAS precharge time $T_{RP}$ according to the output signal $T_{RP\_OUT}$.

Figure 3:
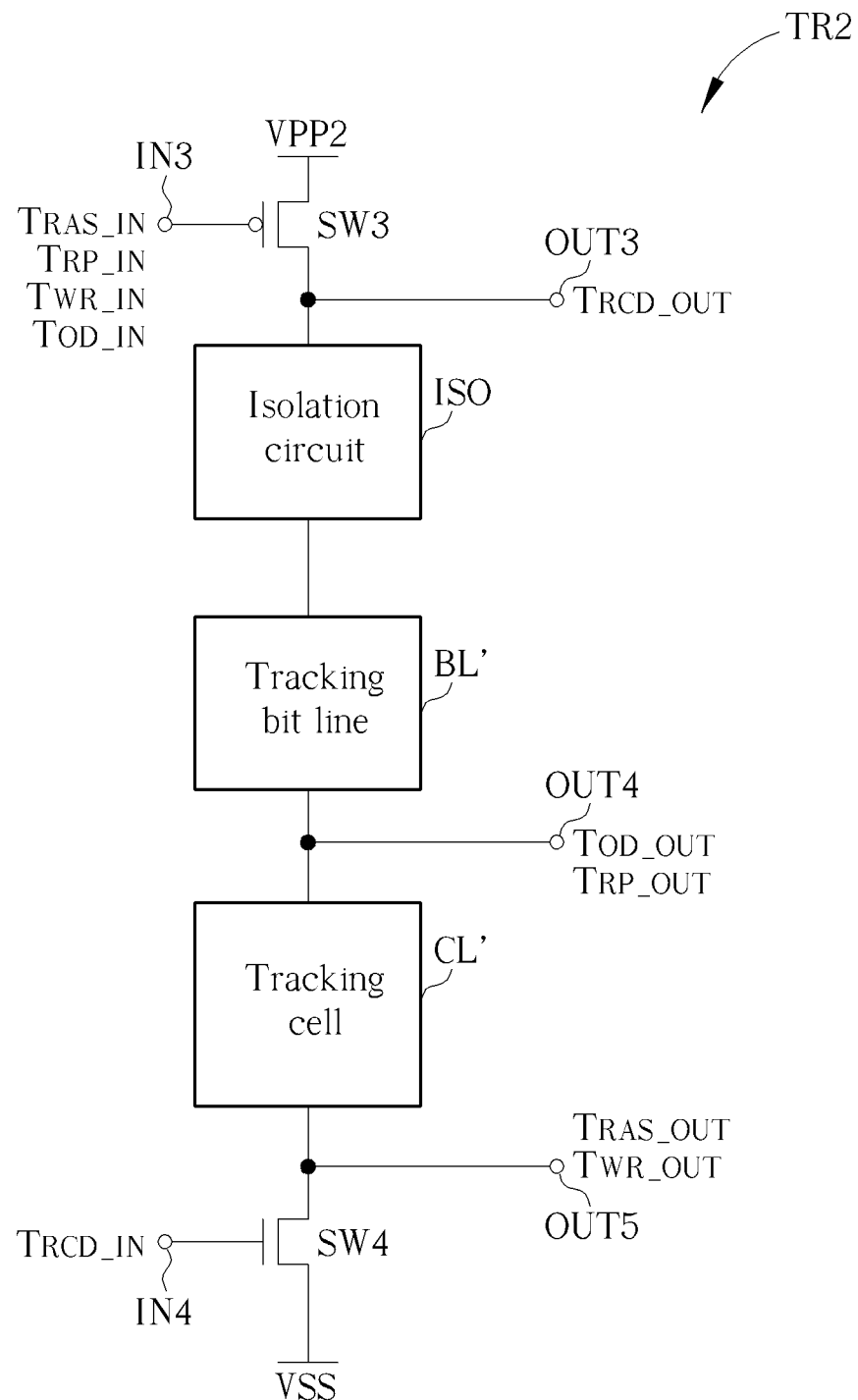

FIG. 3 is a diagram of the second tracking circuit TR2 according to an embodiment of the present invention. The second tracking circuit TR2 includes a tracking bit line BL', a tracking cell CL', an isolation circuit ISO, switches SW3-SW4, input ends IN3-IN4, and output ends OUT3-OUT5. The switch SW3 includes a first end coupled to a bias voltage VPP2, a second end coupled to the output end OUT3, and a control end coupled to the input end IN3. The switch SW4 includes a first end coupled to a bias voltage VSS, a second end coupled to the output end OUT5, and a control end coupled to the input end IN4. The tracking bit line BL' and the isolation circuit ISO are coupled in series between the output end OUT3 and the output end OUT4. The tracking cell CL' is coupled between the output end OUT4 and the output end OUT5. The switches SW3 and SW4 may be complimentary transistors. In an embodiment, the switch SW3 may be a P-MOSFET, the switch SW2 may be an N-MOSFET, and the bias voltage VPP2 is larger than the bias voltage VSS.

When receiving an input signal $T_{RAS\_IN}$ or an input signal $T_{WR\_IN}$ at the input end IN3, the switch SW3 is turned on and the bias voltage VPP2 may be transmitted to the tracking cell CL' via the tracking bit line BL', thereby allowing the second tracking circuit TR2 to provide an output signal $T_{RAS\_OUT}$ associated with the RAS access time $T_{RAS}$ or an output signal $T_{WR\_OUT}$ associated with the write recovery time $T_{WR}$ at the output end OUT5. Therefore, the controller 50 may track the RAS access time $T_{RAS}$ according to the output signal $T_{RAS\_OUT}$ or track the write recovery time $T_{WR}$ according to the output signal $T_{WR\_OUT}$.

When receiving an input signal $T_{RP\_IN}$ at the input end IN3, the switch SW3 is turned on and the tracking bit line BL' may be precharged by the bias voltage VPP2, thereby allowing the second tracking circuit TR2 to provide an output signal $T_{RP\_OUT}$ associated with the RAS precharge time $T_{RP}$ at the output end OUT4. Therefore, the controller 50 may track the RAS precharge time $T_{RP}$ according to the output signal $T_{RP\_OUT}$.

When receiving an input signal $T_{OD\_IN}$ at the input end IN3, the switch SW3 is turned on and the tracking bit line BL' may be charged with overdrive by the bias voltage VPP2, thereby allowing the second tracking circuit TR2 to provide an output signal $T_{OD\_OUT}$ associated with the overdrive time $T_{OD}$ at the output end OUT4. Therefore, the controller 50 may track the overdrive time $T_{OD}$ according to the output signal $T_{OD\_OUT}$.

When receiving an input signal $T_{RCD\_IN}$ at the input end IN4, the switch SW4 is turned on and the bias voltage VSS may be transmitted to the tracking bit line BL' via the tracking cell CL', thereby allowing the second tracking circuit TR2 to provide an output signal $T_{RCD\_OUT}$ associated with the RAS to CAS delay time $T_{RCD}$ at the output end OUT3. Therefore, the controller 50 may track the RAS to CAS delay time $T_{RCD}$ according to the output signal $T_{RCD\_OUT}$.

In the embodiment of the present invention, the first bi-directional tracking circuit TR1 and the second bi-directional tracking circuit TR2 may adopt devices having line-widths larger than those of the devices in the DRAM 10. For example, the line-width of the tracking word line WL' may be larger than the word line WL, the line-width of the tracking bit line BL' may be larger than the bit line BL, and the line-width of the tracking cell CL' may be larger than the cell CL.

In the memory device 100 according to the present invention, the first bi-directional tracking circuit TR1 is configured to track the timing constraints associated with turning on the word line or turning off the word line. The second bi-directional tracking circuit TR2 is configured to track timing constraints associated with precharging the bit line, sensing the bit line, the bit line writing into the cell, and the bit line reading from the cell. Therefore, the present invention may track all timing constraints using two bi-directional tracking circuits, thereby improving overall system efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device with bi-directional tracking of timing constraints, comprising:
    a dynamic random access memory (DRAM) comprising:
        a cell;
        a word line for turning on or turning off the cell; and
        a bit line for writing a first charge into the cell or receiving a second charge stored in the cell;
    a first bi-directional tracking circuit configured to track a first timing constraint which is associated with an operation of turning on the word line or turning off the word line; and
    a second bi-directional tracking circuit configured to track a second timing constraint which is associated with an operation of turning on the bit line, turning off the bit line, the bit line writing the first charge into the cell, or the bit line reading the second charge from the cell.

2. The memory device in claim 1, wherein the first bi-directional tracking circuit comprises:
    a first input end and a second input end;
    a first output end and a second output end;
    a tracking word line coupled between the first output end and the second output end;
    a first switch comprising:
        a first end coupled to a first bias voltage;
        a second end coupled to the first output end; and
        a control end coupled to the first input end; and
    a second switch comprising:
        a first end coupled to a second bias voltage smaller than the first bias voltage;

a second end coupled to the second output end; and
a control end coupled to the second input end.

3. The memory device in claim 2, wherein the first switch and the second switch are complimentary transistors.

4. The memory device in claim 2, wherein:
the first timing constraint is a row address strobe (RAS) to column address strobe (CAS) delay time;
the first input end is arranged to receive an input signal associated with the first timing constraint; and
the second output end is arranged to output an output signal associated with the first timing constraint.

5. The memory device in claim 2, wherein:
the first timing constraint is a RAS precharge time;
the second input end is arranged to receive an input signal associated with the second timing constraint; and
the first output end is arranged to output an output signal associated with the second timing constraint.

6. The memory device in claim 1, wherein the second bi-directional tracking circuit comprises:
a first input end and a second input end;
a first output end, a second output end and a third output end;
an isolation circuit coupled between the first output end and the second output end;
a tracking word line coupled in series to the isolation circuit and coupled between the first output end and the second output end;
a tracking cell coupled between the second output end and the third output end;
a first switch comprising:
a first end coupled to a first bias voltage;
a second end coupled to the first output end; and
a control end coupled to the first input end; and
a second switch comprising:
a first end coupled to a second bias voltage smaller than the first bias voltage;
a second end coupled to the third output end; and
a control end coupled to the second input end.

7. The memory device in claim 6, wherein the first switch and the second switch are complimentary transistors.

8. The memory device in claim 6, wherein:
the second timing constraint is a RAS to CAS delay time or a write recovery time;
the first input end is arranged to receive an input signal associated with the second timing constraint; and
the third output end is arranged to output an output signal associated with the second timing constraint.

9. The memory device in claim 6, wherein:
the second timing constraint is a RAS precharge time or an overdrive time;
the first input end is arranged to receive an input signal associated with the second timing constraint; and
the second output end is arranged to output an output signal associated with the second timing constraint.

10. The memory device in claim 6, wherein:
the second timing constraint is a RAS to CAS delay time or a write recovery time;
the second input end is arranged to receive an input signal associated with the second timing constraint; and
the first output end is arranged to output an output signal associated with the second timing constraint.

11. The memory device in claim 1, wherein a line-width of the first tracking circuit and a line-width of the second tracking circuit are larger than a line-width of the DRAM.

* * * * *